United States Patent [19]

Briefer

[11] Patent Number: 4,603,308
[45] Date of Patent: Jul. 29, 1986

[54] TEMPERATURE STABLE OSCILLATOR

[75] Inventor: Dennis K. Briefer, Marlboro, Mass.

[73] Assignee: Setra Systems, Inc., Acton, Mass.

[21] Appl. No.: 748,338

[22] Filed: Jun. 24, 1985

[51] Int. Cl.$^4$ ............................................. H03K 3/023
[52] U.S. Cl. ..................................... 331/143; 331/66;
331/176
[58] Field of Search ............... 331/57, 66, 108 D, 135,
331/143, 176, 111; 330/104, 137

[56] References Cited

PUBLICATIONS

Rufus E. Gordon, Stable Wideband Relaxation Oscillator Using Three Inverting Amplifiers, National Bureau of Standards Technical Note No. 437, Nov. 1967, pp. 21–23.

*Primary Examiner*—Eugene R. LaRoche
*Assistant Examiner*—Robert J. Pascal
*Attorney, Agent, or Firm*—Lahive & Cockfield

[57] ABSTRACT

An oscillator including a non-inverting amplifier coupled in series with an inverting amplifier. A first feedback network couples the output from the non-inverting amplifier to the input of that amplifier by way of a capacitor C. A second feedback network couples the output of the inverting amplifier to the input of the non-inverting amplifier by way of a series connected resistor R, and includes a capacitor coupled between the input of that non-inverting amplifier and a reference potential. A third feedback network generates a feedback signal proportional to the difference between the average voltage at the output of the non-inverting amplifier and the average voltage at the output terminal of the inverting amplifier, and couples that feedback signal to the input of the inverting amplifier.

21 Claims, 5 Drawing Figures

TEMPERATURE STABLE OSCILLATOR

FIELD OF THE INVENTION

The present invention is in the field of electronic circuitry, and more particularly relates to temperature stable oscillators having their frequency determined at least in part by a capacitance.

BACKGROUND OF THE DISCLOSURE

Electronic oscillators having their frequency determined at least in part by a capacitance have been used in many applications. Certain of these applications require highly stable operation under conditions of varying temperature. For example, certain capacitance measuring circuits incorporate such oscillators where the capacitor-to-be-measured, or sensor capacitor, controls the frequency of oscillation. Where such circuits may be used over a varied temperature, it is important that circuits provide a signal representative the capacitance of the sensor capacitor, independent of temperature. One use of such an oscillator is a pressure transducer, where the sensor capacitor has a characteristic capacitance which varies with ambient pressure.

In the prior art, temperature-stable oscillators have been developed with complex, and correspondingly expensive, compensation networks which offset nominal oscillator frequency changes with temperature. Moreover, the required degree of temperature stability for an oscillator has been an extremely important factor in determining the oscillator cost.

Accordingly, it is an object of the present invention to provide an improved oscillator.

Another object is to provide an oscillator characterized by a relatively high degree of temperature stability.

Yet another object is to provide an improved oscillator charcterized by a relatively low cost and a relatively high degree of temperature stability.

SUMMARY OF THE INVENTION

Briefly, an oscillator in accordance with the present invention includes a plurality of amplifiers, each amplifier having an input terminal pair (including a first and a second input terminal) and at least one output terminal pair (including a first and a second output terminal). Each amplifier is characterized by a substantially linear operating region between two saturation operating regions, where the characteristic voltage gain G(T) in the linear region changes as a function of temperature. For each amplifier, G(T) is representative of the ratio of the potential difference between the first and second terminals of the output terminal pair to the potential difference between the first and second terminals of the input terminal pair. Generally, the gains track from amplifier to amplifier; that is, if G(T) for one amplifier increases (or decreases) with increasing temperature, then the gains for the other amplifiers also increase (or decrease) with increasing temperature.

In one form of the invention, the first and second output terminals of a first amplifier are dc coupled to the first and second input terminals of a second amplifier, and the polarity of the gain G(T) of the first amplifier is opposite to the polarity of the gain G(T) of the second amplifier. Preferably, the first amplifier is non-inverting, i.e., G(T) of the first amplifier is positive.

A first feedback network couples the first output terminal of the first (or non-inverting) amplifier to the first input terminal of that amplifier by way of a series capacitor C. A second feedback network couples the first output terminal of the second (or inverting) amplifier to the first input terminal of the first amplifier by way of a series-connected resistor R. The second feedback network includes a capacitor coupled between the first input terminal of the first amplifier and a reference potential, such as ground potential. In some embodiments, a by-pass capacitor is in series with the resistor R.

A third feedback network is adapted to generate a feedback signal proportional to the difference between the average voltage at the first output terminal of the first amplifier and the average voltage at the first output terminal of the second amplifier. This feedback signal is resistively coupled to the first input terminal of the first amplifier.

With this configuration, particularly where the feedback signal is generated by the third feedback network is characterized by a constant of proportionality which is much greater than unity, an oscillatory signal is provided at the first output terminal of the second amplifier which has a frequency f, substantially a function of the product of the resistance of resistor R and the capacitance of capacitor C. The frequency of the oscillatory signal at the output of the first amplifier is substantially stable with varying temperature. Moreover, a substantially 50% duty signal is maintained for that signal.

By maintaining a capacitor C to be relatively high compared with the capacitance of the capacitor between the first input terminal of the first amplifier and the reference potential, the frequency of oscillation is substantially independent of the capacitance at the input terminals of the first amplifier.

Particularly, where the gain of the inverting and non-inverting amplifiers are decreasing functions of temperature and where the transit delay through those amplifiers are increasing functions of temperature, the oscillatory signal in the output of the inverting amplifier is highly independent of temperature variations.

The first feedback network may further include a pair of parallel feedback paths coupled in series between the first output terminal of the first amplifier and the capacitor C. The first feedback path includes a resistor $R_1$, and the second feedback path includes a third amplifier having its first terminals coupled in series with a resistor $R_2$, where the polarity of G(T) of the third amplifier matches that of the first amplifier, and where the resistances of $R_1$ and $R_2$ are small compared with the resistance of R. In various embodiments, the resistance of $R_1$ may be zero (effectively shorting out these two parallel feedback paths), or the ratio of the resistances of $R_2$ and $R_1$ may be greater than unity, or less than unity, and in the latter cases, the resistance of $R_1$ may be zero.

In one form of the invention, the third feedback network may have the form of a differential amplifier having an inverting input terminal resistively coupled to the first output terminal of the non-inverting amplifier, and having a non-inverting input terminal resistively coupled to the first output terminal of the inverting amplifier. The output terminal of the differential amplifier is resistively coupled to the first input terminal of the non-inverting amplifier. The third feedback network further includes a feedback capacitor coupled between the inverting input terminal of the differential amplifier and the output terminal of the differential amplifier, and a corresponding capacitor coupled between the non-inverting input terminal of the differential amplifier and a reference potential. With this configuration, the feedback signal generated by the differential amplifier is relatively slowly changing compared to the oscillator frequency.

By way of example, the inverting and non-inverting amplifiers may have the form of digital logic gates, particularly CMOS gates. These gates may have the form of exclusive OR gates wired to perform the inverting and non-inverting functions, as required. Alternatively, ECL or other types of devices/gates may be used.

In another form of the present invention, the first and second output terminals of a first amplifier may be coupled to the first and second input terminals respectively of a second amplifier by way of the first and second terminals respectively of an intermediate amplifier, where the gains G(T) of each of these amplifiers is negative; i.e., all are inverting amplifiers in their linear operating region. In this form, three feedback networks are employed which are similar to the first, second and third feedback networks in the above described form of the invention, except that the first feedback network couples the first output terminal of the first amplifier by way of a resistor $R_A$ to a reference point, and couples the first output terminal of the intermediate amplifier by way of a second resistor $R_B$ to the reference point, and couples the reference point by way of capacitor C to the first input terminal of the first amplifier.

BRIEF DESCRIPTION OF THE DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENT

Figure 1:
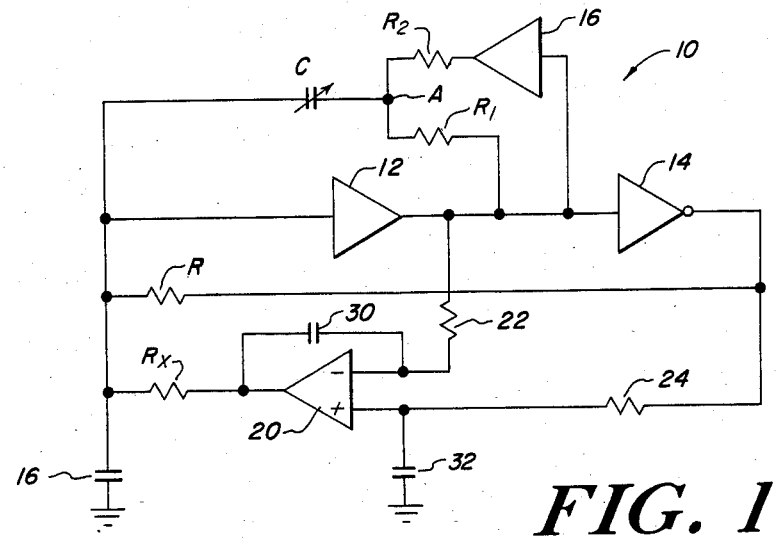
FIG. 1 shows, in schematic form, an exemplary embodiment of the present invention.

FIG. 1 shows a general form of an exemplary oscillator 10 in accordance with the present invention. Oscillator 10 includes a non-inverting amplifier 12 and an inverting amplifier 14. Amplifiers 12 and 14 are coupled in series with the output terminal of amplifier 14 being dc coupled to the input terminal of amplifier 12. In various embodiments of this invention, the amplifier 12 may have a plurality of output terminals, each providing substantially the same signal, for example, having buffered outputs.

As shown, the input and output terminals of amplifiers 12 and 14 are "ground referenced." In other forms of the invention, the amplifiers may be differential amplifiers with explicit pairs of terminals at the input and output.

A first feedback network includes a pair of parallel feedback paths between the output terminal of amplifier 12 and a reference point A, where the first feedback path includes resistor $R_1$ and the second feedback path includes a series-connected resistor $R_2$ and amplifier 16. The first feedback network also includes a capacitor C coupled between point A input terminal of amplifier 12. As described below, the resistors $R_1$ and $R_2$ of FIG. 1 may be selected to have differing circuit configurations. For example, $R_2$ may be an open circuit effectively removing that resistor and amplifier 16. Alternatively, $R_1$ may be a short circuit (i.e., zero resistance) and $R_2$ may be an open circuit effectively removing $R_1$, $R_2$ and amplifier 16. In still other forms the ratio of the resistances of $R_1$ and $R_2$ may be otherwise selected to optimize oscillator stability over temperature.

A second feedback network includes a resistor R coupled between the output terminal of amplifier 14 and the input terminal of amplifier 12, and includes a capacitor 16 coupled between the input terminal of amplifier 12 and a reference (ground) potential. The value for the capacitor 16 is relatively high compared with the capacitance associated with capacitor C so that the frequency of network 10 is substantially independent of the input capacitance of the non-inverting amplifier 12.

A third feedback network is also coupled between the outputs of amplifiers 12 and 14 and the input terminal of amplifier 12. As shown in FIG. 1, this third feedback network includes a differential amplifier 20 having its inverting input dc coupled (by way of resistor 22) to the output terminal of non-inverting amplifier 12, and having its inverting input dc coupled (by way of resistor 24) to the output terminal of inverting amplifier 14. Feedback capacitor 30 is coupled between the non-inverting input and the output terminal of amplifier 20, and a corresponding capacitor 32 is coupled between the non-inverting input terminal of amplifier 20 and ground potential.

With this configuration, the third feedback network generates a feedback signal at the output terminal of amplifier 20 which is proportional to the difference between the average voltage at the output terminal of amplifier 12 and the average voltage at the output terminal of amplifier 14. This feedback signal is resistively coupled (by resistor $R_x$, which is greater than resistor R) to the input terminal of non-inverting amplifier 12. Generally, the capacitors 30 and 32 and amplifier 20 are selected so that the feedback signal generated by amplifier 20 is a lower frequency signal than the nominal oscillator frequency of the network 10. Preferably, the gain of amplifier 20 is relatively high so that the constant of proportionality of the difference signal produced by amplifier 20 is relatively high compared with unity. Consequently, the oscillation of network 10 occurs with substantially a 50% duty cycle.

Figure 2:
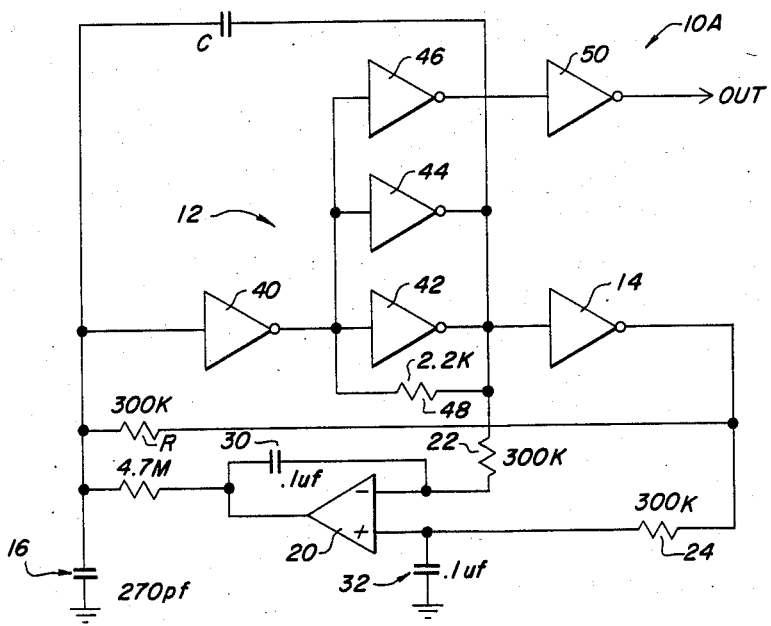
FIGS. 2–4 show in schematic form, further embodiments of the invention.
Figure 3:
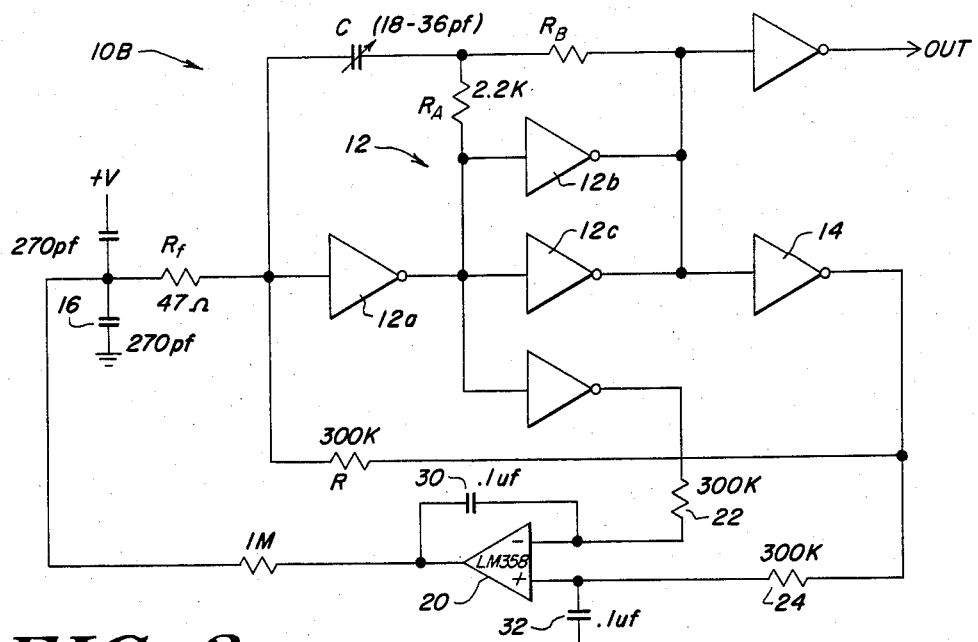
Figure 4:
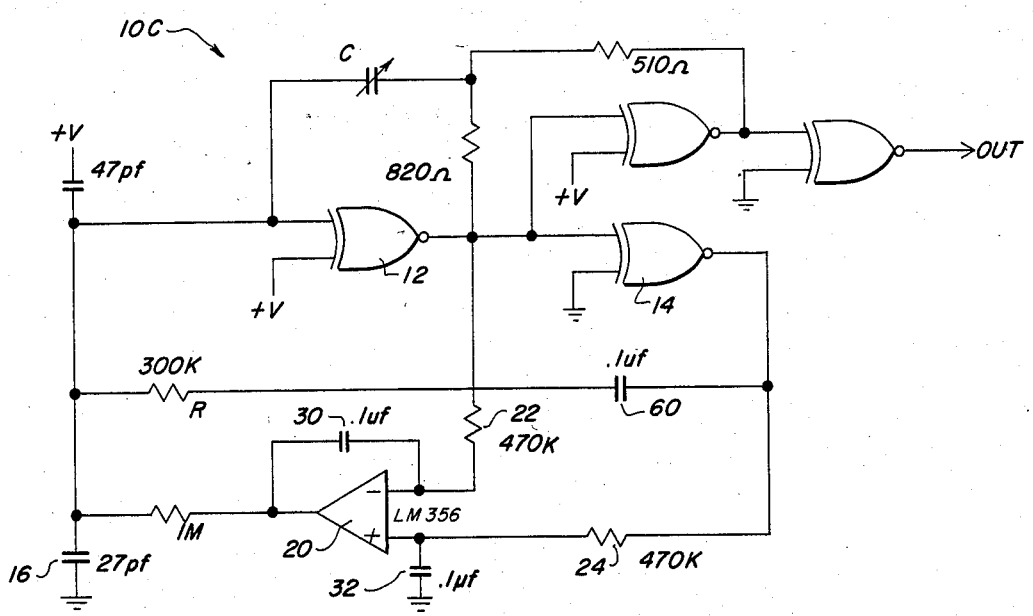

FIGS. 2–4 show detailed schematic representations of further embodiments 10A, 10B and 10C of the present invention. In those figures, elements corresponding to elements in FIG. 1 are identified with the same reference designations.

FIG. 2 shows an embodiment utilizing complimentary metal-oxide-semiconductor (CMOS) integrated circuit logic gates for the respective amplifiers 12 and 14. In FIG. 2, amplifier 12 includes cascaded inverting CMOS gates 40 and 42. Amplifier 12 further includes an additional CMOS gates 44 and a resistor 48 coupled in parallel across amplifier 42. A series-coupled pair of output buffer inverting CMOS gates 48 and 50 are also coupled to the output of amplifier 40. Gate 50 provides a buffered output signal for the network 10A. With this configuration, the two parallel output amplifiers 42 and 44 and resistor 48 provide a relatively low impedance for driving the capacitor C quickly, so that that capacitor may be charged in operation in time relatively short compared with the cycle time of the network 10. Amplifier 46 provides a buffered output signal (OUT).

In operation, with the component values shown in FIG. 2, the amplifiers 40, 42, 44, 46, 50 and 14 may all be provided on a single CMOS integrated circuit type 74HC04 and the differential amplifier may an operational amplifier type LM358. Where the capacitor C is a capacitor on the order of 8 picofarads, the network 10A oscillates at a frequency approximately 50 KHz with a variation of approximately two parts per million per degree centigrade over a temperature range −20 to +70 degrees centigrade.

FIG. 3 shows a similar oscillator network 10B utilizing CMOS integrated circuit types 74HC04 and a capacitor C in the range 18-36 picofarads. The resistor $R_f$ aids the positive regenerative feedback around non-inverting amplifier 12 (made up of amplifiers 12a, 12b and 12c), allowing a rapid rise time during regenerative operation. In the configuration of FIG. 3, with $R_A=2.2$ Kohms and $R_B=0$ ohms, the approximate output frequency of the oscillator 10B is on the order of 50 KHz with a stability of approximately 2 parts per million per degree centigrade over the temperature range −20 to +70 centigrade. In the networks of FIGS. 2 and 3, the output signals of the respective amplifiers are approximately rail-to-rail voltages, as provided by the power supply for those CMOS integrated circuits.

FIG. 4 shows oscillator network 10C which is another embodiment of the present invention. The amplifiers of network 10C are provided by exclusive NOR gates following a single integrated circuit type 74HCZ66. The respective exclusive NOR gates are suitably arranged to establish the inverting and non-inverting characteristics of amplifier 14 and 12, respectively by coupling of one of the gate inputs to a high logic level or a low logic level. In operation, network 10C operates a frequency on the order of 50 KHz, depending on the value of capacitor C with a stability on the order of 3 parts per million per degree centigrade over the temperature range −20° to +70° C. In the embodiment of FIG. 4, the second feedback network (that is, the network of resistor R) also includes a series coupled capacitor 60, which permits operation using amplifiers having relatively large offsets. This capacitor may also be used in network of the form of FIGS. 2 and 3. Generally, this latter capacitor operates as a bypass capacitor and thus is relatively large.

With the present invention, oscillation at substantially temperature-stable output frequency f may be maintained, where the frequency is principally a function of the product of the resistance of resistor R and the capacitance of capacitor C. Accordingly, with a temperature stable resistor R, the oscillator of the invention may readily be utilized in transducers which have variable capacitor sensing needs, such as pressure transducers. With such configurations, the frequency from the oscillator will change with variation of the ambient pressure applied to the sensor capacitor C (provided the resistor R is temperature compensated, or temperature stable).

Each amplifier in the above embodiments may be generally considered to have at least one input terminal pair (including a first input terminal, shown in the Figures, and a second input terminal, not shown) and at least one output terminal pair (including a first output terminal, shown in the Figures, and an output terminal, not shown).

Figure 5:
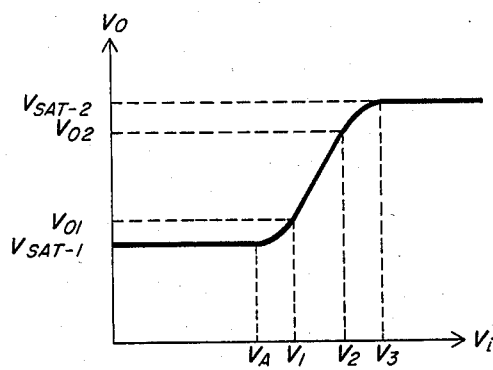
FIG. 5 shows a voltage transfer characteristic for amplifiers adapted for use in the embodiments of FIGS. 1–4.

FIG. 5 shows a voltage transfer characteristic $V_o/V_i$ having a smooth and continuous derivative $dV_o/dV_i$ which generally characterizes the amplifiers used in the above-described embodiments, where for each amplifier the voltage $V_o$ is representative of the voltage at the first output terminal of that amplifier and the voltage $V_i$ is representative of the voltage at the first input terminal of that amplifier. In various forms of the invention, the amplifiers may be differential amplifiers, where the respective input and output terminal pairs are explicitly available, or may be ground referenced amplifiers, where single input and output terminals are used and the ground potential serves as the other terminal of each pair. With ECL amplifiers the input terminals of the input terminal pairs are explicit, while the CMOS amplifiers, an input terminal is explicit and the other is implicit, or may be ground potential.

Referring to the characteristic of FIG. 5, the output voltage $V_o$ is substantially equal to a first saturation value $V_{SAT-1}$ when $V_i$ is less than a value $V_A$ and equal to a second saturation value $V_{SAT-2}$ when $V_i$ is greater than a value $V_B$, where $V_B$ is greater than $V_A$.

When $V_i$ is in a range between $V_1$ and $V_2$ between $V_A$ and $V_B$, where $V_2$ is greater than $V_1$, $V_o$ is substantially linear, having the form $G(T)V_i+A$, where $G(T)$ substantially equals $(V_{o2}-V_{o1})/(V_2-V_1)$ and A substantially equals $V_{o2}-G(T)V_2$. $G(T)$ changes as a function of temperature. $G(T)$ thus is representative of the ratio of the potential difference between the first and second terminals of the output terminal pair to the potential difference between the first and second terminals of the input terminal pair.

When $G(T)$ is greater than zero (as shown in FIG. 5), $V_i$ increases monotonically as $V_i$ increases from $V_A$ to $V_1$ and from $V_2$ to $V_B$, and $V_{SAT-2}$ is greater than $V_{SAT-1}$. When $G(T)$ is less than zero, $V_i$ decreases monotonically as $V_i$ increases from $V_A$ to $V_1$ and from $V_2$ to $V_B$, and $V_{SAT-1}$ is greater than $V_{SAT-2}$.

For the form of the invention having a non-inverting first amplifier coupled in series to an inverting second amplifier, as shown in FIG. 1, it is preferred that the range of $V_o$ of the first amplifier between the values $V_{o1}$ and $V_{o2}$ of that amplifier be co-extensive with or extend beyond the range of $V_i$ of the second amplifier between the values $V_1$ and $V_2$ of that second amplifier. Also, it is preferred that the range of $V_o$ of the second amplifier between the values $V_{o1}$ and $V_{o2}$ of that second amplifier be co-extensive with or extend beyond the range of $V_i$ of the first amplifier between the values $V_1$ and $V_2$ of that first amplifier.

In these embodiments, $V_{SAT-2}$ of the various amplifiers equals $V_{SAT-2}$ of the other amplifiers plus a value C, and $V_{SAT-1}$ of the various amplifier equals $V_{SAT-1}$ of other amplifiers minus the same value C. In other words, the amplifiers all have $V_{SAT}$ values which track together with the value C. As a consequence, the third feedback network acts as a current source, dynamically pulling the first input terminal of the first amplifier (e.g. amplifier 12) to the threshold (switching) level for that amplifier, even over relatively broad excursions of temperature. Where the $V_o/V_i$ characteristic is substantially symmetrical, as in FIG. 5, the threshold level $V_T$ corresponds to the input voltage $V_i$ which provides an output voltage $V_o$ equal to $(V_{SAT-2}-V_{SAT-1})/2$. With these dynamic range constraints, the respective amplifiers may effectively switch "rail-to-rail" in a manner providing a substantially 50% duty cycle during operation.

Similarly, for the form of the invention having three inverting amplifiers coupled in series, as shown in FIG. 3, it is preferred that the range $V_o$ of each amplifier between values $V_{o1}$ and $V_{o2}$ be co-extensive with or extend beyond the range of $V_i$ between values $V_1$ and $V_2$ of the amplifier to which it is coupled.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. An oscillator comprising:

a plurality of amplifiers, wherein each of said amplifiers has an input terminal pair including a first and second input terminal and at least one output terminal pair including a first and a second output terminal, and being characterized by a substantially linear operating region between two saturation operating regions, wherein the characteristic voltage gain $G(T)$ in said linear region changes as a function of temperature, T, wherein $G(T)$ is representative of the ratio of the potential difference between the first and second terminals of said output terminal pair to the potential difference between the first and second terminals of said input terminal pair, and wherein said changes in $G(T)$ of said amplifiers with temperature are substantially tracking, and wherein a first of said amplifiers is coupled to a second of said amplifiers, said first amplifier having its first and second output terminals dc coupled to the first and second input terminals respectively of said second amplifier, and wherein the polarity of $G(T)$ of said first amplifier is opposite to the polarity of $G(T)$ of said second amplifier, and further comprising:

A. a first feedback network including means for coupling said first output terminal of said first amplifier by way of a series capacitor C to said first input terminal of said first amplifier, B. a second feedback network including means for coupling said first output terminal of said second amplifier to said first input terminal of said first amplifier by way of a series connected resistor R, and including at least one capacitor coupled between said first input terminal of said first amplifier and a reference potential, and C. a third feedback network including means for generating a feedback signal proportional to the difference between the average voltage at said first output terminal of said first amplifier and the average voltage at said first output terminal of said second amplifier, and including means for d.c. coupling said feedback signal to said first input terminal of said first amplifier, whereby said oscillator network oscillates at a frequency f.

2. An oscillator according to claim 1 wherein each of said amplifiers is characterized by a voltage transfer characteristic $V_o/V_i$ having a smooth and continuous derivative $dV_o/dV_i$, where $V_o$ is the voltage at said first output terminal of said amplifier and $V_i$ is the voltage at said first input terminal of said amplifier, each of said amplifiers being operative whereby the voltage $V_o$ at its first output terminal is substantially equal to:

a first predetermined value $V_{SAT\text{-}1}$ when $V_i$ is less than a first predetermined value, $V_A$, a second predetermined value $V_{SAT\text{-}2}$ when $V_i$ is greater than a second predetermined value $V_B$, where $V_B$ is greater than $V_A$, $G(T)V_i + A$ when $V_i$ is in a predetermined range between $V_1$ and $V_2$, where $V_1$ and $V_2$ are between $V_A$ and $V_B$, where $V_2$ is greater than $V_1$, where $G(T)$ is substantially equal to $(V_{02}-V_{01})/(V_2-V_1)$ and A is substantially equal to $V_{02}-G(T)V_2$, and where $G(T)$ changes as a function of temperature, a value which changes monotonically from $V_{SAT\text{-}1}$ to $V_{01}$ as $V_i$ increases from $V_A$ to $V_1$, a value which changes monotonically from $V_{02}$ to $V_{SAT\text{-}2}$ as $V_i$ increases from $V_2$ to $V_B$, and wherein the range of $V_o$ of said first amplifier between said values $V_{01}$ and $V_{02}$ of said first amplifier is co-extensive with or extends beyond the range of $V_i$ of said second amplifier between said values $V_1$ and $V_2$ of said second amplifier, and wherein the range of $V_o$ of said second amplifier between said values $V_{01}$ and $V_{02}$ of said second amplifier is co-extensive with or extends beyond the range of $V_i$ of said first amplifier between said values $V_1$ and $V_2$ of said first amplifier, and wherein $V_{SAT\text{-}2}$ of said second amplifier equals $V_{SAT\text{-}2}$ of said first amplifier plus a value C, and wherein $V_{SAT\text{-}1}$ of said second amplifier equals $V_{SAT\text{-}1}$ of said first amplifier minus said value C.

3. An oscillator according to claims 1 or 2 wherein the polarity of $G(T)$ of said first amplifier is positive and the polarity of $G(T)$ of said second amplifier is negative.

4. An oscillator according to claim 3 wherein the frequency of oscillation f is substantially a function of the product of the resistance of resistor R and the capacitance of capacitor C.

5. An oscillator according to claim 4 wherein said first feedback network further includes a pair of parallel feedback paths coupled in series between said output terminal pair of said first amplifier and said capacitor C, the first of said feedback paths including a resistor $R_1$ and the second of said feedback paths including a third one of said amplifiers coupled in series with a resistor $R_2$, where the polarity of $G(T)$ of said third amplifier is the same as the polarity of $G(T)$ of said first amplifier, and wherein the values of the resistance of resistors $R_1$ and $R_2$ are small compared to the value of the resistance of resistor R.

6. An oscillator according to claim 5 wherein the ratio of the values of the resistances of resistors $R_2$ and $R_1$ is greater than unity.

7. An oscillator according to claim 6 wherein the value of the resistance of resistor $R_1$ is substantially zero.

8. An oscillator according to claim 5 wherein the ratio of the values of the resistances of resistors $R_1$ and $R_2$ is greater than unity.

9. An oscillator according to claim 8 wherein the value of the resistance of the resistor $R_2$ is substantially equal to zero.

10. An oscillator according to claim 3 wherein said third feedback network includes a differential amplifier having an inverting input terminal resistively coupled to said first output terminal of said first amplifier, a non-inverting input terminal resistively coupled to said first output terminal of said second amplifier, and an output terminal resistively coupled to said first input terminal of said first amplifier, said third feedback network further including a feedback capacitor coupled between said output terminal of said differential amplifier and said non-inverting input terminal of said differential amplifier, and a capacitor coupled between said non-inverting input terminal of said differential amplifier and a reference voltage.

11. An oscillator according to claim 3 wherein said coupling means of said second feedback network includes a capacitor coupled in series with said resistor R.

12. An oscillator comprising:

a plurality of amplifiers, wherein each of said amplifiers has an input terminal pair including a first and second input terminal and at least one output terminal pair including a first and a second output terminal, and being characterized by a substantially linear operating region between two saturation operating regions, wherein the characteristic voltage gain G(T) in said linear region changes as a function of temperature, T, wherein G(T) is representative of the ratio of the potential difference between the first and second terminals of said output terminal pair to the potential difference between the first and second terminals of said input terminal pair, and wherein said changes in G(T) of said amplifiers with temperature are substantially tracking, and wherein a first of said amplifiers is coupled to a second of said amplifiers by way of an intermediate one of said amplifiers, said first amplifier having its first and second output terminals dc coupled to the first and second input terminals respectively of said intermediate amplifier, and said intermediate amplifier having its first and second output terminals dc coupled to the first and second input terminals of said second amplifier, and wherein the polarities of G(T) of each of said first, second and intermediate amplifiers is negative, and further comprising:

A. a first feedback network including means for coupling said first output terminal of said first amplifier by way of a first feedback resistor $R_A$ to a reference point, means for coupling said first output terminal of said intermediate amplifier by way of a second feedback resistor $R_B$ to said reference point, and means for coupling said reference point by way of a series capacitor C to said first input terminal of said first amplifier, B. a second feedback network including means for coupling said first output terminal of said second amplifier to said first input terminal of said first amplifier by way of a series-connected resistor R, and including at least one capacitor coupled between said first input terminal of said first amplifier and a reference potential, and C. a third feedback network including means for generating a feedback signal proportional to the difference between the average voltage at said first output terminal of said first amplifier and the average voltage at said first output terminal of said second amplifier, and including means for d.c. coupling said feedback signal to said first input terminal of said first amplifier, whereby said oscillator network oscillates at a frequency f.

13. An oscillator according to claim 12 wherein each of said amplifiers is characterized by a voltage transfer characteristic $V_o/V_i$ having a smooth and continuous derivative $dV_0/dV_i$, where $V_0$ is the voltage at said first output terminal of said amplifier and $V_i$ is the voltage at said first input terminal of said amplifier, each of said amplifiers being operative whereby the voltage $V_o$ at said first output terminal is substantially equal to:

a first predetermined value $V_{SAT-1}$ when $V_i$ is less than a first predetermined value, $V_A$, a second predetermined value $V_{SAT-2}$ when $V_i$ is greater than a second predetermined value $V_B$, where $V_B$ is greater than $V_A$, $G(T)V_i + A$ when $V_i$ is in a predetermined range between $V_1$ and $V_2$, where $V_1$ and $V_2$ are between $V_A$ and $V_B$, where $V_2$ is greater than $V_1$, where $G(T)$ is substantially equal to $V_{02} - V_{01})/(V_2 - V_1)$ and A is substantially equal to $V_{02} - G(T)V_2$, and where G(T) changes as a function of temperature, a value which changes monotonically from $V_{SAT-1}$ to $V_{01}$ as $V_i$ increases from $V_A$ to $V_1$, a value which changes monotonically from $V_{02}$ to $V_{SAT-2}$ as $V_i$ increases from $V_2$ to $V_B$ wherein the range of $V_o$ of said first amplifier between said values $V_{01}$ and $V_{02}$ of said first amplifier is co-extensive with or extends beyond the range of $V_i$ of said intermediate amplifier between said values $V_1$ and $V_2$ of said intermediate amplifier, and wherein the range of $V_o$ of said intermediate amplifier between said values $V_{01}$ and $V_{02}$ of said intermediate amplifier is co-extensive with or extends beyond the range of $V_i$ of said second amplifier between said values $V_1$ and $V_2$ of said second amplifier, and wherein the range of $V_o$ of said second amplifier between said values $V_{01}$ and $V_{02}$ of said second amplifier is co-extensive with or extends beyond the range of $V_i$ of said first amplifier between said values $V_1$ and $V_2$ of said first amplifier, and wherein $V_{SAT-2}$ of said second amplifier equals $V_{SAT-2}$ of said first amplifier plus a value C, and wherein $V_{SAT-1}$ of said second amplifier equals $V_{SAT-1}$ of said first amplifier minus said value C, and wherein $V_{SAT-2}$ of each amplifier equals $V_{SAT-2}$ of the other amplifiers plus a value C and $V_{SAT-1}$ of each amplifier equals $V_{SAT-1}$ of the other amplifiers minus said value C.

14. An oscillator according to claim 12 or 13 wherein $R_A$ and $R_B$ are selected whereby the frequency of oscillation f is substantially a function of the product of the resistance of resistor R and the capacitance of capacitor C.

15. An oscillator according to claim 14 wherein said first feedback network further includes a pair of parallel feedback paths coupled between said reference point and said capacitor C, the first of said feedback paths including a resistor $R_1$ and the second of said feedback paths including a third one of said amplifiers its first input and output terminals coupled in series with a resistor $R_2$, where the polarity of G(T) of said third amplifier is greater than zero and wherein the values of the resistance of resistors $R_1$ and $R_2$ are small compared to the value of the resistance of resistor R.

16. An oscillator according to claim 15 wherein the ratio of the values of the resistances of resistors $R_2$ and $R_1$ is greater than unity.

17. An oscillator according to claim 16 wherein the value of the resistance of resistor $R_1$ is substantially equal to zero.

18. An oscillator according to claim 15 wherein the ratio of the values of the resistances of resistors $R_1$ and $R_2$ is greater than unity.

19. An oscillator according to claim 12 or 13 wherein said third feedback network includes a differential amplifier having an inverting input terminal resistively coupled to said first output terminal of said intermediate amplifier, a non-inverting input terminal resistively coupled to said first output terminal of said second amplifier, and a first output terminal resistively coupled to said first input terminal of said first amplifier, said third feedback network further including a feedback capacitor coupled between said first output terminal of said differential amplifier and said non-inverting input terminal of said differential amplifier, and a capacitor coupled between said non-inverting input terminal of said differential amplifier and a reference voltage.

20. An oscillator according to claim 12 or 13 further including a fourth of said amplifiers, the first input terminal of said fourth amplifier being coupled to the first output terminal of said first amplifier, wherein the polarity of G(T) of said fourth amplifier is negative, wherein said third feedback network includes a differential amplifier having an inverting input terminal resistively coupled to said first output terminal of said fourth amplifier, a non-inverting input terminal resistively coupled to said first output terminal of said second amplifier, and an output terminal d.c. coupled to said first input terminal of said first amplifier, said third feedback network further including a feedback capacitor coupled between said output terminal of said differential amplifier and said non-inverting input terminal of said differential amplifier, and a capacitor coupled between said non-inverting input terminal of said differential amplifier and a reference voltage.

21. An oscillator according to claim 12 or 13 wherein said coupling means of said second feedback network includes a capacitor coupled in series with said resistor R.

* * * * *